US006968481B2

(12) United States Patent
Muff

(10) Patent No.: US 6,968,481 B2
(45) Date of Patent: Nov. 22, 2005

(54) METHOD AND DEVICE FOR ADAPTING/TUNING SIGNAL TRANSIT TIMES ON LINE SYSTEMS OR NETWORKS BETWEEN INTEGRATED CIRCUITS

(75) Inventor: Simon Muff, Höhenkirchen (DE)

(73) Assignee: Infineon Technologies AG, Munich (DE)

( * ) Notice: Subject to any disclaimer, the term of this patent is extended or adjusted under 35 U.S.C. 154(b) by 1028 days.

(21) Appl. No.: 09/776,951

(22) Filed: Feb. 5, 2001

(65) Prior Publication Data

US 2001/0031507 A1 Oct. 18, 2001

(30) Foreign Application Priority Data

Feb. 3, 2000 (DE) .................................. 100 04 649

(51) Int. Cl.$^7$ ............................................. G06F 11/00
(52) U.S. Cl. .................... 714/701; 438/14; 438/15; 438/17; 324/543; 716/8; 716/12
(58) Field of Search ................. 714/701; 716/8, 716/12; 438/15–17; 324/534

(56) References Cited

U.S. PATENT DOCUMENTS 4,876,702 A * 10/1989 Lesko ..................... 375/376
6,223,334 B1 * 4/2001 Suaris et al. .............. 716/12

* cited by examiner

*Primary Examiner*—Guy J. Lamarre
(74) *Attorney, Agent, or Firm*—Laurence A. Greenberg; Werner H. Stemer; Ralph E. Locher

(57) ABSTRACT

A method and a device adapt/tune signal transit times on line systems or networks between integrated circuits which are mounted on printed circuit boards. Fine tuning of differences in transit times can be easily carried out by capacitive load structures disposed on conductor tracks in the vicinity of chip housings of the integrated circuits on the printed circuit boards by disconnecting connecting lines using a cutting laser.

20 Claims, 2 Drawing Sheets

METHOD AND DEVICE FOR ADAPTING/TUNING SIGNAL TRANSIT TIMES ON LINE SYSTEMS OR NETWORKS BETWEEN INTEGRATED CIRCUITS

BACKGROUND OF THE INVENTION

1. Field of the Invention

The invention relates to a method and to a device for adapting/tuning signal transit times on line systems or networks between integrated circuits which are mounted on printed circuit boards, in particular high-speed memory modules, and to a memory group which can be manufactured using the latter.

In high-speed memory modules, so-called high performance DRAMs, the signal transit times of different networks or signal transmission lines must be tuned to one another, at the module or system level, within a few picoseconds in order to ensure the desired speed and efficiency of the memory module.

Such differences in transit times are mainly influenced by the capacitive element of the individual housings with which a memory module is equipped. However, due to manufacturing process limits, the individual components can be tuned to one another and to the printed circuit board only within an order of magnitude of approximately 20 fF. This is sufficient for a maximum delay time window of approximately 20 ps. The fine tuning must be carried out on the application chip after appropriate measurement. It is usually necessary to repeat this measuring and tuning step. If relatively small delay time windows and finer tuning are necessary, it has until now been the practice to make use of expensive base materials such as ceramics and/or to apply C4 mounting techniques.

SUMMARY OF THE INVENTION

It is accordingly an object of the invention to provide a cost-effective, simple and flexible method, a device for carrying out the method, and a memory module that can be manufactured by the method which overcomes the above-mentioned disadvantageous of the prior art apparatus and methods of this general type. In particular, it is an object of the invention to provide a method, a device for carrying out the method, and a memory module which can be manufactured by the method, with which delay time windows of less than 20 ps can be implemented on a printed circuit board made of conventional FR-4 material when any desired chips are applied, without performing capacitive fine tuning after mounting the chips and measuring the delay time on the module.

With the foregoing and other objects in view there is provided, in accordance with the invention a method of the generic type having the following steps:

A) printed circuit boards are provided with capacitive load structures on at least one conductor track path of the line system or network in the vicinity of the housing or housings of the integrated circuit or circuits;

B) all of the relevant delay or signal transit times on the network or the line system between the integrated circuits are measured; and C) specific capacitive load structures are selectively disconnected from the at least one conductor track path depending on the measurement result in step B, in order to minimize maximum signal delays which occur.

In accordance with an added feature of the invention, steps B) and C) can also be implemented repeatedly.

In accordance with an additional feature of the invention, the capacitive load structures which are provided on the printed circuit board on at least one of the lines of the network in the vicinity of the housing or housings of the integrated circuit or circuits can have a capacitance in the sub-femtofarad range. This enables extremely small delay time windows of less than 5 ps to be obtained on conventional FR-4 material.

In accordance with another feature of the invention, the selective disconnection step for disconnecting specific capacitive load structures is preferably carried out by means of laser cutting. In this way, with the method according to the invention, individual ones of the capacitive load structures provided in the vicinity of the housing footprint area can be selectively disconnected from the line paths by laser cutting after measuring the delay times of the individual line paths which are part of the network, and the maximum transit time delays which occur can thus be minimized.

The connections of the capacitive load structures to the actual signal transmission lines of the networks must not be covered with solder. This is in order to permit performance of laser cutting which is known in the art in printed circuit board production.

In accordance with a further feature of the invention, the method can also be used to adapt signal transit times on line systems or networks between high-speed DRAM memory modules mounted on printed circuit boards, without previous tuning of the memory modules. The method can be used with chips and housings which are tuned differently, with a plurality of DRAM modules disposed on one printed circuit board which have different materials, and can also be used to compensate manufacturing tolerances of printed circuit boards and/or chip housings. Because the fine tuning is possible after the printed circuit board is equipped, parts whose respective transit time specifications do not comply with the specification range can be subsequently repaired and do not need to be discarded. This makes it possible to increase the yield when the delay time window is small.

In addition, the manufacturing tolerances of the printed circuit board and of the chip housing which are difficult to influence can be compensated.

With the foregoing and other objects in view there is provided, in accordance with the invention a device which is suitable for carrying out the inventive method that includes, in combination:

securing means for securing at least one printed circuit board which is equipped with an integrated circuit or circuits and which is provided with capacitive load structures on at least one conductor track path of a line system or network in the vicinity of the housing or housings of the integrated circuit or circuits;

measuring means for measuring relevant delay or signal transit times on the networks or line systems between the integrated circuits on the printed circuit board or boards, and disconnection means for selectively disconnecting specific capacitive load structures in such a way that maximum signal delay times measured by the measuring means are minimized.

With the foregoing and other objects in view there is provided, in accordance with the invention a memory module which can be manufactured with the method according to the invention described above. The printed circuit board is provided with disconnectable line structures, such as surfaces or vias, on at least one conductor track in the vicinity of the housing footprint area of the memory module. The conductor track is part of a signal transmission network or line system which transmits signals to and from the memory module. The disconnectable line structures forming a capacitive load with respect to the conductor track and the housing of the mounted memory module. Certain ones of the capacitive load structures are selectively disconnectable at conductor tracks with a maximum signal delay in order to minimize known maximum signal transit times.

Although the invention is illustrated and described herein as embodied in a method and device for adapting/tuning signal transit times on line systems or networks between integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
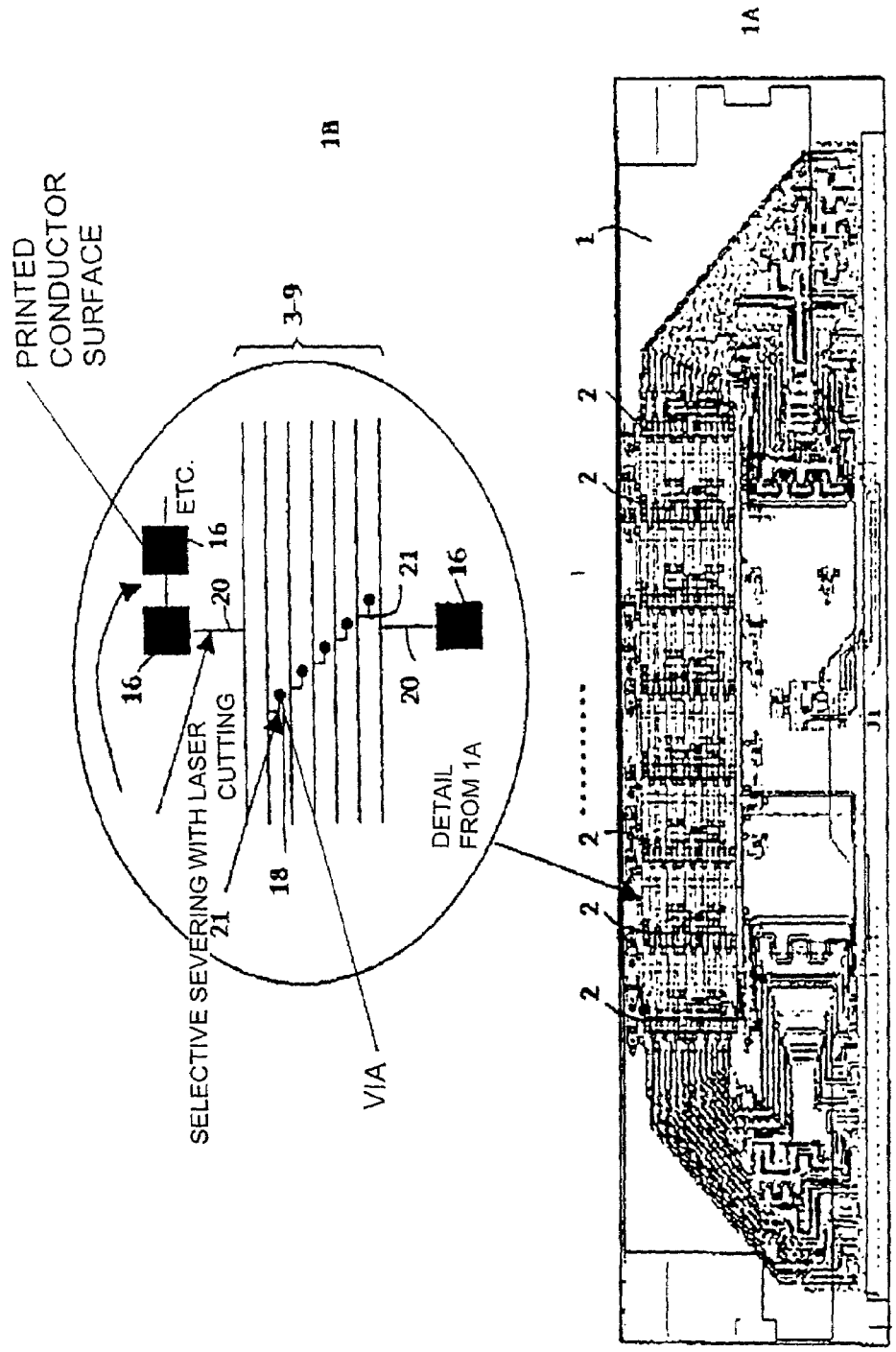
FIG. 1A shows a plan view of a memory module.
FIG. 1B shows an enlarged plan view of a portion of the memory module enabling capacitive load structures to be seen.

Referring now to the figures of the drawing in detail and first, particularly, to FIG. 1A thereof, there is shown a plan view of a printed circuit board 1 which is equipped with memory modules 2 (for example eight). The printed circuit board 1 can be composed of a customary FR-4 material.

According to FIG. 1B, conductor track paths 3–9, which are part of a network, for example a data or address bus, connecting the memory modules 2, have capacitive load structures in the form of printed conductor surfaces 16 which are connected to one another and to a respective conductive track 3–9 by means of thin printed connecting lines 20. In a similar way, capacitive load structures may be provided in the form of vias 18 which are also individually connected by means of thin, printed-on connecting lines 21 with respective conductor track paths 3–9.

According to the invention, after measurement of the relevant delay or signal transit times of the networks or lines between the memory modules 2 which are mounted on the printed circuit board 1, specific capacitive load structures, i.e. individual conductor surfaces 16 and/or vias 18, can be selectively disconnected in order to minimize the maximum signal delays which occur. In order to disconnect the conductor surfaces 16 or the vias 18, the thin connecting lines 20 and 21 are respectively disconnected by means of a cutting laser.

The delay times can be tuned or compensated in a delay time window of less than 20 ps by measuring the delay or signal transit times on the signal transmission lines of a network between the integrated circuits, i.e. the memory modules 2, and by selectively disconnecting the capacitive load structures. The steps can also be carried out repeatedly.

The capacitive load structures, i.e. the conductor surfaces 16 and/or the vias 18, shown in FIG. 1B can thus be embodied in such a way that their capacitance lies respectively in the femtofarad or sub-femtofarad range with respect to the chip housing in question.

Figure 2:
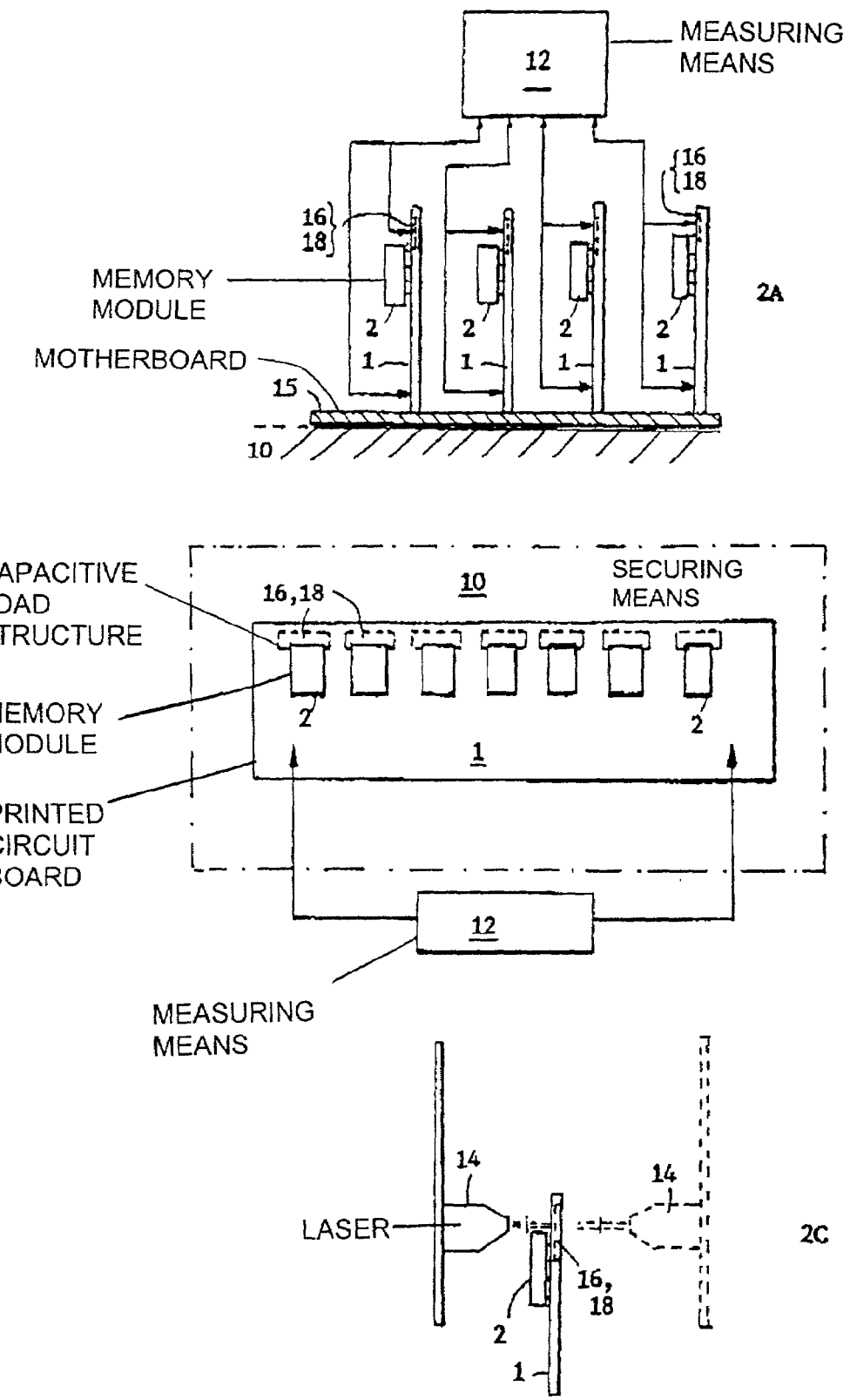
FIG. 2A shows a schematic front view of a device designed to carry out a measuring step of the inventive method.
FIG. 2b shows a schematic plan view of the device designed to carry out the measuring step of the method.
FIG. 2C shows a schematic view of a device designed to carry out a step of selectively disconnecting specific capacitive structures.

FIGS. 2A, 2B and 2C are respective schematic views of a configuration designed to carry out the method according to the invention. FIGS. 2A and 2B respectively show, in a front view and a plan view, the measuring of delay times or signal transit times on the networks which connect individual integrated circuits to one another. For example, such integrated circuits can be memory modules 2 mounted on a single printed circuit board 1 as shown in FIG. 2B or on a plurality of printed circuit boards 1 as shown in FIG. 2A. FIG. 2C shows the disconnection of capacitive load structures 16, 18.

A plurality of printed circuit boards 1, as shown in FIG. 2A, can be mounted here on one motherboard 15, or the measurement can be carried out on a single printed circuit board 1 as shown in FIG. 2B. The measuring means 12 are provided with measuring sensors which provide a low-capacitance, i.e. purely ohmic, contact with the individual conductor tracks of a line system or network of interest, specifically at the plug contact of the individual memory modules at the individual module level or motherboard level.

Furthermore, FIGS. 2A and 2B show securing means, for example a table 10 which is designed to secure at least one printed circuit board 1.

FIG. 2C shows a device which is designed for carrying out the method according to the invention, during the execution of a disconnection step. During the disconnection step, individual connecting lines 20, 21 (FIG. 1B) on the printed circuit board 1 are selectively disconnected by means of a cutting laser 14 in accordance with the measurement result determined with the configuration shown in FIGS. 2A and 2B.

FIG. 2C shows clearly that the disconnection of connecting lines can be carried out from both sides of the printed circuit board by laser 14.

It is to be noted that the connecting lines 20, 21 (shown in FIG. 1B) of the capacitive load structures with the actual conductor tracks must not be covered with solder. This is in order to permit the preferred laser cutting according to the invention.

The method according to the invention permits extremely small delay time windows of less than 5 ps to be obtained on conventional FR-4 material of the printed circuit board. The present method makes it possible to balance chips and housings which are not tuned or are tuned differently, even when chips and housings are manufactured using different process technologies, and even when the individual components on a printed circuit board have different materials.

Because the fine tuning with the method according to the invention is carried out after the printed circuit board is equipped with the memory modules, components which do not comply with a specification range can be subsequently repaired and do not therefore need to be rejected. This permits the manufacturing yield to be increased when there is a small delay time window present.

In addition, the manufacturing tolerances of the printed circuit boards which cannot usually be influenced, and those of the chip housings which are difficult to influence, can be compensated with the method according to the invention.

It is to be noted that the configuration illustrated in FIGS. 2A, 2B, and 2B shows a basic configuration in schematic form only, and that details of the configuration can be implemented differently therefrom provided that they do not deviate from the features of the appended claims.

I claim:

1. A method for adapting/tuning signal transit times on line systems or networks between integrated circuits which are mounted on printed circuit boards, which comprises:
   providing printed circuit boards having capacitive load structures disposed on at least one conductor track path of a line system or network and disposed adjacent a location selected from the group consisting of a housing of an integrated circuit and housings of integrated circuits;
   measuring all relevant delay or signal transit times on the line system or network between the integrated circuits;
   selectively disconnecting specific ones of the capacitive load structures from the at least one conductor track path depending on the measured delay or signal transit times, in order to minimize maximum signal delays which occur.

2. The method according to claim 1, which comprises repeating the measuring step and the selectively disconnecting step.

3. The method according to claim 1, which comprises providing the capacitive load structures with a capacitance in a femtofarad range.

4. The method according to claim 1, which comprises providing the capacitive load structures with a capacitance in a sub-femtofarad range.

5. The method according to claim 1, which comprises performing the step of selectively disconnecting the capacitive load structures by laser cutting.

6. The method according to claim 1, which comprises providing the integrated circuits as high-speed memory modules on the printed circuit boards.

7. The method according to claim 1, which comprises adapting the signal transit times on the line systems or the networks between high-speed DRAM memory modules mounted on the printed circuit boards.

8. The method according to claim 7, which comprises not tuning chips and housings.

9. The method according to claim 8, which comprises providing the DRAM memory modules with different materials.

10. The method according to claim 9, which comprises tuning chips and housings differently.

11. The method according to claim 10, which comprises providing the DRAM memory modules with different materials.

12. The method according to claim 7, which comprises providing the DRAM memory modules with different materials.

13. The method according to claim 7, which comprises compensating manufacturing tolerances of the printed circuit boards.

14. The method according to claim 13, which comprises compensating manufacturing tolerances of chip housings.

15. The method according to claim 7, which comprises compensating manufacturing tolerances of chip housings.

16. A configuration for adapting/tuning signal transit times on line systems or networks between integrated circuits which are mounted on printed circuit boards, the device comprising:
   a securing device for securing at least one printed circuit board having integrated circuits and having capacitive load structures disposed on at least one conductor track path of a line system or network adjacent a location selected from the group consisting of a housing of one of the integrated circuits and housings of the integrated circuits;
   a measuring device for measuring relevant delay or signal transit times on the line system or the network between the integrated circuits on the at least one printed circuit board; and
   a disconnection device for selectively disconnecting specific ones of the capacitive load structures in such a way that maximum delay times measured by the measuring device are minimized.

17. The configuration according to claim 16, comprising the at least one printed circuit board, the capacitive load structures having a form selected from the group consisting of surfaces and vias.

18. The configuration according to claim 17, wherein said disconnection device includes a cutting laser.

19. The configuration according to claim 16, wherein said disconnection device includes a cutting laser.

20. A memory module comprising:
   a printed circuit board and at least one memory module mounted on it;
   said printed circuit board including at least one conductor track forming part of a signal transmission network or line system which transmits signals to and from said memory module, said at least one conductor track having a region adjacent a housing footprint area of said memory module;
   said printed circuit board having disconnectable line structures selected from the group consisting of surfaces and vias, said disconnectable line structures disposed at said region adjacent the housing footprint area of said memory module;
   said disconnectable line structures forming capacitive load structures with respect to said at least one conductor track and a housing of said memory module when mounted;
   certain ones said capacitive load structures being selectively disconnectable at conductor tracks with a maximum signal delay in order to minimize known maximum signal transit times.

* * * * *